United States Patent [19]

Rossi et al.

[11] Patent Number: 5,576,648
[45] Date of Patent: Nov. 19, 1996

[54] TEMPERATURE STABLE CIRCUIT FOR CONTROLLED CURRENT DISCHARGE DURING THE DRIVING OF AN INDUCTIVE LOAD

[75] Inventors: Giorgio Rossi, Nerviano; Franco Cocetta, Cornaredo; Fabio Marchio, Sedriano, all of Italy

[73] Assignee: SGS-Thomson Microelectronics, S.r.l., Agrate Brianza, Italy

[21] Appl. No.: 202,043

[22] Filed: Feb. 23, 1994

[30] Foreign Application Priority Data

Apr. 30, 1993 [EP] European Pat. Off. ............. 93830189

[51] Int. Cl.⁶ ..................... H03K 3/00; H03K 17/16; H03K 17/687; G05F 1/40
[52] U.S. Cl. ................... 327/110; 327/378; 327/389; 327/427; 327/434; 323/282; 323/284
[58] Field of Search ..................... 327/108, 110, 327/538, 539, 541, 542, 543, 378, 389, 427, 434; 323/222, 223, 285, 287, 289, 282; 361/18, 91, 187

[56] References Cited

U.S. PATENT DOCUMENTS

| | | | |
|---|---|---|---|
| 4,287,436 | 9/1981 | Tezuka et al. | 327/110 |
| 4,860,152 | 8/1989 | Osborn | 361/91 |
| 4,882,532 | 11/1989 | Gariboldi et al. | 323/287 |
| 4,967,309 | 10/1990 | Hoffman | 323/287 |

FOREIGN PATENT DOCUMENTS

| | | |
|---|---|---|
| 159233 | 10/1985 | European Pat. Off. . |
| 399754 | 11/1990 | European Pat. Off. . |
| 2593946 | 1/1986 | France . |

Primary Examiner—David C. Nelms
Assistant Examiner—Trong Phan
Attorney, Agent, or Firm—Robert Groover; Betty Formby

[57] ABSTRACT

A circuit for controlled discharge of energy stored in an inductive load, comprising an active semiconductor device (T) connected serially with the inductive load (L) between first and second terminals of a voltage supply source and having a control terminal for connection to a driver circuit (C), and a control circuit (R1, R2, COMP) connected between the inductive load and said control terminal. The control circuit comprises a voltage divider (R1, R2) connected between the inductive load (L) and the first terminal of the voltage supply source, and a comparator (COMP) having first and second input terminals respectively connected to the voltage divider and to a voltage reference and an output terminal which is coupled to the control terminal of the active element (T).

34 Claims, 2 Drawing Sheets

TEMPERATURE STABLE CIRCUIT FOR CONTROLLED CURRENT DISCHARGE DURING THE DRIVING OF AN INDUCTIVE LOAD

CROSS-REFERENCE TO RELATED APPLICATION

This application claims priority from EPC App'n 93830189.2, filed 04/30/93, which is hereby incorporated by reference.

BACKGROUND AND SUMMARY OF THE INVENTION

This invention relates to an electronic temperature-compensated circuit which is useful for controlled current discharge while inductive loads are being driven, and particularly to such a circuit which is integrated monolithically.

Within the scope of this invention, the problems connected with inductive loads as used in motor vehicle fuel injection control devices will be considered by way of example. In such devices, the driving of the current flow through an inductance in the injector allows the injector to open and close. In such a case, as the inductive load is being driven, it is very important that the control current flowing through the load be cut off within the shortest possible time, in order for the injector closing time to be made short and the amount of fuel injected accurately metered out.

It is recognized that, in general, the driving of inductive loads (such as solenoids, motors, or flyback inductors) brings about some problems during the transients. In fact, upon cutting off the current flowing through an inductor, a voltage surge (positive or negative overvoltage) immediately begins to occur at the inductor. That overvoltage is due to the induced electromotive force which resists any change in the current from the value attained during the "on" period, i.e. during the charging phase.

In the instance of fuel injection control in a motor vehicle, as herein considered, the load has a terminal at a fixed supply potential, so that the potential increase will occur at the node between the load element and the driver circuit. Accordingly, the amplitude of the voltage peaks at said node must be limited, since otherwise such peaks may cause breakage of the junctions in the semiconductor elements provided within the driver or other circuits connected to that same inductive load. In addition, with monolithically intergrated circuits, such peaks may be a triggering cause of parasitic transistors.

A state-of-art approach provides for the introduction, between the driver circuit and the inductive load, of circuitry including power elements for the controlled discharge of current from the load, so that the energy stored within the inductive load can be dissipated. The voltage at the load, after attaining a predetermined maximum, will remain constant for a time and then drop back to zero along with the current, following full discharge through the power elements themselves. The discharge time is therefore dependent on the maximum voltage value attained at the inductor. In such prior approaches, therefore, the circuit discharge also serves to limit the voltage rise to a predetermined maximum value. This voltage limiting effect is referred to as clamping in technical literature.

Where the current quenching time through the inductive load must be accurately controlled, this is accomplished using a current discharge circuit which is dimensioned so as to allow a suitable maximum voltage value to be selected, since, as mentioned, the duration of the discharge phase depends directly on the maximum voltage attained at the inductor upon turning off the driver circuit. It is desirable that the adjustment can be performed irrespective of outside conditions, in particular independently of temperature. A standard approach has been heretofore to use, for current discharge, the same power transistor—whether of the field-effect (usually MOS) type or the bipolar type—as is used for driving the load. Auxiliary control circuit arrangements control the voltage value at the load and automatically turn on the power element upon that voltage attaining its predetermined maximum value. Two main circuit solutions have been proposed.

A first one consists of connecting one or more Zener diodes between the control terminal of the driver power transistor and the inductive load. That is, the Zener diodes are arranged to set a maximum voltage value VD at the inductive load, because as that set value—which is equal to the sum of the Zener voltages plus the transistor's threshold voltage—is exceeded, the diodes will begin to conduct, thereby enabling conduction through the transistor until the inductor is discharged. A disadvantage of this prior circuit is that a peak voltage value exactly equal to the desired value at the inductor cannot always be obtained, because it would be dependent on the sum of the discrete Zener values, and optimum clamping cannot be achieved. Furthermore, since the voltage drops across the Zener diodes and at the control terminal of the power transistor depend on temperature in different degrees, compensation can only be obtained for certain definite values of VD.

In an attempt to obviate such drawbacks, the second known solution provides a combination of diodes, Zener diodes, and transistors in the current discharge circuit. One of the last-mentioned circuit arrangements is depicted in FIG. 1. The circuit in FIG. 1 operates as follows.

Upon the driver circuit C for the power element turning off the transistor T, an overvoltage is generated at node D. As this voltage reaches a value $VD=VZ+VBE+V'BE+VG-S$ (where, VZ is the Zener voltage of Z1, VBE is the voltage drop between the base and the emitter of transistor T1, V'BE is the voltage across diode D1, and VGS is the voltage drop between the gate and the source of transistor T when this is a field-effect transistor), the Zener diode begins to conduct, causing the transistor T to be turned back on. Thus, current discharge from the inductive load is started.

It should be noted that Z1, T1 and D1 in the Figure may represent a number N of Zener diodes, transistors and diodes connected in series, whereby VD is the result of several potential drops combined. In that way the discharge time of the inductive load can be optimized. That circuit has, however, a disadvantage in that the voltage value at the node D is not fully independent of temperature changes nor of the selected value of VD, although it does provide a broader range of temperature independence than the previously mentioned conventional solution.

It is an advantage of the disclosed invention to provide a current discharge circuit whose operation and threshold voltage are essentially independent of temperature. A further advantage is that the temperature-independence is retained as the maximum voltage value at any inductive load varies.

The disclosed circuits are particularly advantageous in automotive applications, e.g. for driving an injection coil. In such applications temperature-independence is particularly necessary to accurately control the timing and duration of fuel injection, and thereby reduce pollution.

BRIEF DESCRIPTION OF THE DRAWING

The present invention will be described with reference to the accompanying drawings, which show important sample embodiments of the invention and which are incorporated in the specification hereof by reference, wherein.

DETAILED DESCRIPTION

Figure 1:
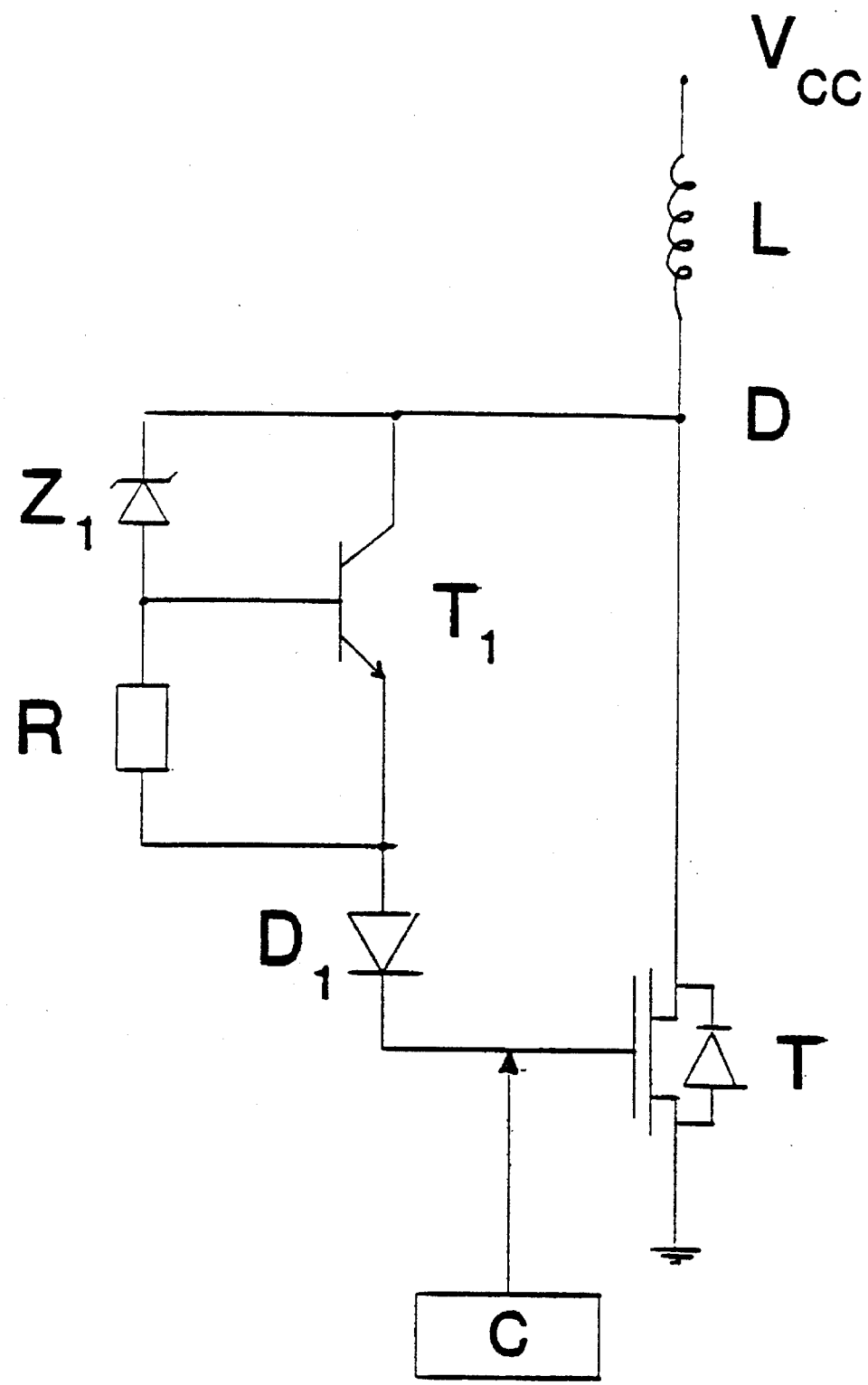
FIG. 1 is a diagram of a known circuit for discharging current while an inductive load is being driven, whose operation has been discussed hereinabove.

The numerous innovative teachings of the present application will be described (by way of example, and not of limitation) with particular reference to a sample preferred embodiment. In both of the drawing figures, L denotes the inductive load, Vcc the voltage supply, and T the transistor through which the current discharge is performed. This transistor is shown as a field-effect transistor, but may be a bipolar type, in accordance with the prior art. In addition, the transistor T would normally be a power transistor. Also shown is a driver circuit as schematically indicated in block form at C. D denotes the node which connects the inductive load to the current discharge control circuit and to the transistor T.

Figure 2:
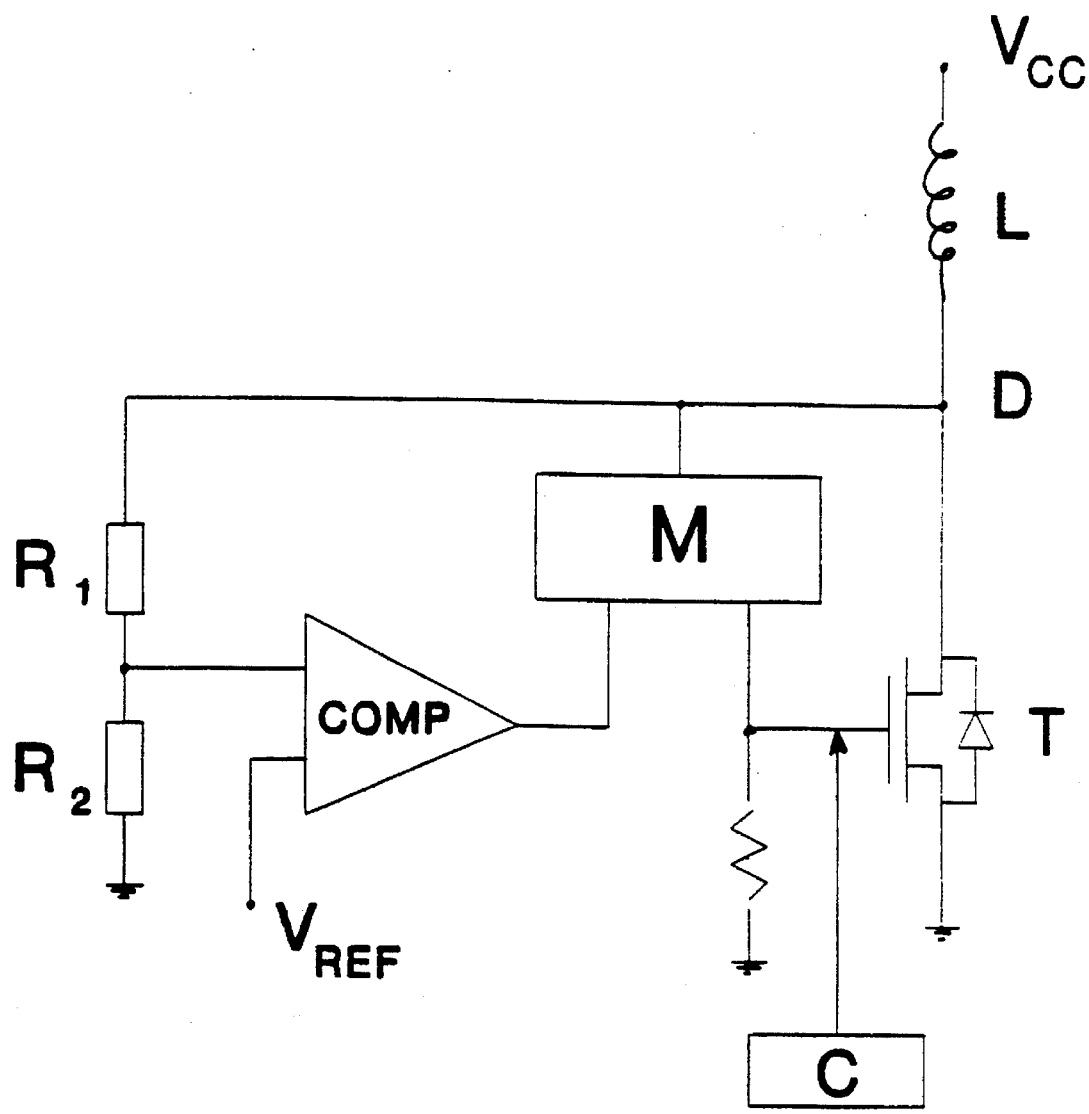
FIG. 2 is a diagram of a circuit for discharging current while an inductive load is being driven, according to this invention.

The circuit diagram in FIG. 2 shows a sample embodiment of the invention, and further comprises a current mirror M, a comparator COMP, a voltage reference VREF, and two resistors R1 and R2 forming a voltage divider. The transistor T is connected in series with the inductive load L between ground and a terminal of a supply voltage source Vcc. Connected to the control terminal T are a driver circuit C and a control circuit which is also connected to the inductive load. The control circuit is operative to determine the mode of turning the transistor T back on while allowing current to be discharged from the inductive load through T. This control circuit comprises, in the example shown, the voltage divider R1, R2 connected between the inductive load and ground, the comparator COMP, and the current mirror M. The comparator COMP has two input terminals connected respectively to the divider and the voltage reference VREF. The current mirror M has an input leg connected to an output terminal of the comparator and an output leg connected to the control terminal of the transistor T, and is supplied from the node D. This innovative circuit operates as follows.

The transistor T is turned on again for current recycling depending on the voltage value at the node D. Upon that voltage attaining a predetermined value VD=VREF(R1 + R2)/R2, which also represents the comparator threshold, the comparator will output a signal causing the transistor to be turned on again. Thus, current recycling is triggered from the inductive load L to clamp the voltage at node D to the value VD. The transistor T is held in the "on" state until all of the inductive load energy is discharged. The choice of VD is readily obtained by suitably proportioning the divider ratio (R1 + R2)/R2. (Of course, each of the resistors R1 and R2 shown in FIG. 2 may represent a number N of resistors). This discharge circuit is highly temperature-independent, because the temperature variation of VD is only dependent on the voltage reference VREF, which can be selected to be temperature-independent. This reference can be expediently provided using, for example, a Widlar circuit (also known as a bandgap voltage reference). It should be noted that VREF may be either positive or negative. The current mirror allows a current to be supplied which may be amplified, if desired. However, it is not essential to the invention, and other circuit elements may be used to have the transistor turned on. It should be considered that where the voltage at node D attains a high value in operation, the resistor R1 and current mirror, being connected to that node, are required to operate at a high voltage. The current-recycling circuit just described has the advantage of being substantially stable over temperature, by virtue of the voltage control being implemented by a divider and a voltage reference being used. Furthermore, any value may be selected for the voltage VD by appropriate variation of the resistive divider.

The actual implementation of the current mirror, in this sample embodiment, is preferably like the conventional configurations shown, e.g., at pages 247 and 269 of P. Gray and R. Meyer, ANALYSIS AND DESIGN OF ANALOG INTEGRATED CIRCUITS (2.ed.1984). However, of course this can be modified in many ways, e.g. by substitution of PMOS transistors for PNP transistors.

According to disclosed innovative embodiments, there is provided: A circuit for controlled discharge of energy from an inductive load, comprising: an active semiconductor element having first and second terminals whereby it is connected in series with the inductive load between first and second terminals of a voltage supply source, and a control terminal for connection to a driver circuit; and a control circuit, connected between the inductive load and the control terminal of the active element, comprising a voltage divider connected between the inductive load and the first terminal of the voltage supply source, and a comparator having first and second input terminals respectively connected to an internal node of the voltage divider and to a temperature-independent and supply-voltage-independent voltage reference, and an output terminal coupled to the control terminal of the active element.

According to disclosed innovative embodiments, there is provided: An integrated circuit, comprising: a terminal for connection to a node between an inductive load and a power transistor; a voltage divider, connected to the terminal to produce a reduced voltage which is proportional to the voltage of the terminal; a comparator, connected to compare the reduced voltage with a temperature-independent and supply-voltage-independent reference voltage, and to produce an output signal which is dependent on the difference therebetween; and intermediate circuitry operatively connected to provide a control signal to the power transistor which is dependent on the output signal, the intermediate circuitry being connected to be powered from the terminal; the control signal output of the intermediate circuitry being connected to be combined with a master control signal which generally selects when the transistor is be turned on and off.

According to disclosed innovative embodiments, there is provided: An integrated circuit, comprising: a terminal for connection to a node between an inductive load and a power transistor; a voltage divider, connected to the terminal to produce a reduced voltage which is proportional to the voltage of the terminal; a comparator, connected to compare the reduced voltage with a temperature-independent and supply-voltage-independent reference voltage, and to produce an output current which is dependent on the difference between the reduced voltage and the reference voltage; and a current mirror operatively connected to provide a control current to the power transistor which is dependent on the output current, the current mirror being connected to be powered from the terminal; the control current output of the intermediate circuitry being connected to be combined with a master control signal which generally selects when the transistor is be turned on and off. A system, comprising: an inductive load to be driven; a power semiconductor element, connected serially with the inductive load between first and second nodes at fixed different voltages, to perform a current discharge therethrough; a driver circuit which provide to the power semiconductor element a master control signal which generally selects when the power element is turned on and off; a terminal for connection to a node between the inductive load and the power semiconductor element; a voltage divider, connected to the terminal to produce a reduced voltage which is proportional to the voltage of the terminal; a voltage reference device, which provide a substantially constant temperature-independent and supply-voltage-independent voltage in a terminal thereof; a comparator circuit, connected to compare the reduced voltage with the voltage provided by the voltage reference device, and to produce an output signal which is dependent on the difference therebetween; the comparator circuit being operatively connected to provide the output signal to the power semiconductor element, and to control the power element; the output signal from the comparator circuit being combined with the master control signal from the driver circuit.

According to disclosed innovative embodiments, there is provided: A system, comprising: an inductive load to be driven; a power transistor, connected serially with the inductive load between a node connected at ground potential and a node at a fixed supply voltage, to perform a current discharge therethrough; a driver circuit which provide to the power transistor a master control signal which generally selects when the power transistor is turned on and off; a terminal for connection to a node between the inductive load and the power transistor; a voltage divider, connected to the terminal to produce a reduced voltage which is proportional to the voltage of the terminal; a voltage reference device, which provide a substantially constant temperature-independent and supply-voltage-independent-voltage in a terminal thereof; a comparator circuit, connected to compare the reduced voltage with the voltage provided by the voltage reference device, and to produce an output signal which is dependent on the difference therebetween; a current mirror operatively connected to provide a control signal to the power transistor which is dependent on the output signal from the comparator circuit, the control signal being combined, to control the power transistor, with the master control signal from the driver circuit.

According to disclosed innovative embodiments, there is provided: A system, comprising: an inductive load to be driven; a power field effect transistor, having source and drain terminals connected, in series with the inductive load, between a node at a fixed supply voltage and a node of constant potential; a driver circuit which provides to the transistor a master control signal which generally selects when the transistor is to be turned on and off; a terminal for connection to a node between the inductive load and the power transistor; first and second resistors, connected in series between a first node which is between the inductive load and the transistor and the node of constant potential, to produce at an intermediate node a reduced voltage which is proportional to the voltage of the first node; a voltage reference circuit, which provides a substantially constant temperature-independent and supply-voltage-independent voltage at a terminal thereof; a comparator, connected to compare the reduced voltage with the voltage provided by the voltage reference device, and to produce at an output terminal thereof an output signal which is dependent on the difference between the reduced voltage and of the voltage from the voltage reference device; a current mirror having input and output legs connected to the first node to be powered therefrom; the input leg being connected to the output terminal of the comparator, and the output leg being connected to a gate terminal of the transistor to provide a control signal which is dependent on the output signal from the comparator, the control signal being combined at the gate terminal with the master control signal from the driver circuit.

According to disclosed innovative embodiments, there is provided: A method of controlling an inductive load with a series power transistor, comprising the steps of: receiving a master control signal which generally selects times for turning the transistor off and on; automatically comparing the voltage of a node between the transistor and the load to a predetermined temperature-independent and supply-voltage-independent constant voltage, and providing an output current whenever the voltage of the node exceeds the predetermined constant voltage; mirroring the output current through a circuit stage which is powered by and referenced to the voltage of the node, to provide a corresponding control current; and combining the control current with a current corresponding to the master control signal, to provide a drive signal which is connected to control the transistor.

It will be recognized by those skilled in the art that the innovative concepts disclosed in the present application can be applied in a wide variety of contexts, and can be modified in a tremendous variety of ways. For example, the transistor T can alternatively be implemented by an IGBT or other power transistor technology, such as a Darlington, which is effective to drive the inductive load and discharge its current.

The voltage divider does not have to consist only of the two resistors shown, but may be implemented in any desired way without impairing its effectiveness.

The current mirror, which in this example is supplied from the node D, could alternatively (but less preferably) be supplied by another potential different from VCC.

For another example, instead of the low-side driver configuration shown in FIG. 2, with the power transistor arranged to drive the load to the supply, the circuit could be a high-side driver configuration with the load being driven to ground by the power transistor.

What is claimed is:

1. A circuit for controlled discharge of energy from an inductive load, comprising:

an active semiconductor element having first and second terminals whereby it is cinnected in series with the inductive load between first and second terminals of a voltage supply source, and a control terminal for connection to a driver circuit: and a control circuit, connected between the inductive load and the control terminal of the active element comprising a voltage divider connected between the inductive load and the first terminal of the voltage supply source, and a comparator having first and second input terminals respectively connected to an internal node of the voltage divider and to a temperature-independent and supply-voltage-independent voltage reference, and an output terminal coupled to the control terminal of the active element, and a current mirror circuit having an input leg connected to the output terminal of the comparator and an output leg connected to the control terminal of the active element.

2. A circuit according to claim 1, wherein said current mirror has a supply terminal connected to the inductive load.

3. A circuit according to claim 1, further comprising a Widlar device connected to provide said voltage reference.

4. A circuit according to claim 1, further comprising a temperature-independent circuit connected to provide said voltage reference.

5. A circuit according to claim 1, wherein said voltage reference is provided by a Widlar device.

6. A circuit according to claim 2, wherein said voltage reference is provided by a Widlar device.

7. A circuit according to claim 1, wherein said active element is a power field-effect transistor, and said first and second terminals and the control terminal thereof are a source terminal, drain terminal, and gate terminal, respectively.

8. A circuit according to claim 1, wherein said active element is a power field-effect transistor, and said first and second terminals and the control terminal thereof are a source terminal, drain terminal, and gate terminal, respectively.

9. A circuit according to claim 2, wherein said active element is a power field-effect transistor, and said first and second terminals and the control terminal thereof are a source terminal, drain terminal, and gate terminal, respectively.

10. A circuit according to claim 3, wherein said active element is a power field-effect transistor, and said first and second terminals and the control terminal thereof are a source terminal, drain terminal, and gate terminal, respectively.

11. An integrated circuit, comprising:

a terminal for connection to a node between an inductive load and a power transistor;

a voltage divider, connected to said terminal to produce a reduced voltage which is proportional to the voltage of said terminal;

a comparator, connected to compare said reduced voltage with a temperature-independent and supply-voltage-independent reference voltage, and to produce an output signal which is dependent on the difference therebetween; and intermediate circuitry operatively connected to provide a control signal to said power transistor which is dependent on said output signal, said intermediate circuitry being connected to be powered from said terminal;

said control signal output of said intermediate circuitry being connected to be combined with a master control signal which generally selects when the transistor is be turned on and off.

12. The integrated circuit of claim 11, wherein said control signal output of said intermediate circuitry is connected directly to an output connection for connection to a control terminal of the power transistor.

13. The integrated circuit of claim 11, wherein said reference voltage is provided by a Widlar device.

14. The integrated circuit of claim 11, further comprising a temperature-independent circuit connected to provide said reference voltage.

15. An integrated circuit, comprising:

a terminal for connection to a node between an inductive load and a power transistor;

a voltage divider, connected to said terminal to produce a reduced voltage which is proportional to the voltage of said terminal;

a comparator, connected to compare said reduced voltage with a temperature-independent and supply-voltage-independent reference voltage, and to produce an output current which is dependent on the difference between said reduced voltage and said reference voltage; and a current mirror operatively connected to provide a control current to said power transistor which is dependent on said output current, said current mirror being connected to be powered from said terminal;

said control current output of said current mirror being connected to be combined with a master control signal which generally selects when the transistor is be turned on and off.

16. The integrated circuit of claim 15, wherein said control current output of said current mirror is connected directly to an output connection for connection to a control terminal of the power transistor.

17. The integrated circuit of claim 15, wherein said current mirror has a supply terminal connected to the inductive load.

18. The integrated circuit of claim 15, wherein said reference voltage is provided by a Widlar device.

19. The integrated circuit of claim 15, further comprising a temperature-independent circuit connected to provide said reference voltage.

20. A system, comprising:

an inductive load to be driven;

a power semiconductor element, connected serially with said inductive load between first and second nodes at fixed different voltages, to perform a current discharge therethrough;

a driver circuit which provide to said power semiconductor element a master control signal which generally selects when said power element is turned on and off;

a terminal for connection to a node between said inductive load and said power semiconductor element; a voltage divider, connected to said terminal to produce a reduced voltage which is proportional to the voltage of said terminal; a voltage reference device, which provide a substantially constant temperature-independent and supply-voltage-independent voltage in a terminal thereof;

a comparator circuit, connected to compare the reduced voltage with the voltage provided by said voltage reference device, and to produce an output signal which is dependent on the difference therebetween;

said comparator circuit being operatively connected to provide the output signal to said power semiconductor element, and to control said power element; the output signal from said comparator circuit being combined with the master control signal from said driver circuit.

21. The system of claim 20, wherein said power semiconductor element is a field-effect transistor.

22. The system of claim 20, wherein said voltage reference is provided by a Widlar device.

23. The system of claim 20, further comprising a temperature-independent circuit connected to provide said voltage reference.

24. A system, comprising:

an inductive load to be driven;

a power transistor, connected serially with said inductive load between a node connected at ground potential and a node at a fixed supply voltage, to perform a current discharge therethrough;

a driver circuit which provide to said power transistor a master control signal which generally selects when said power transistor is turned on and off;

a terminal for connection to a node between said inductive load and said power transistor;

a voltage divider, connected to said terminal to produce a reduced voltage which is proportional to the voltage of said terminal; a voltage reference device, which provide a substantially constant temperature-independent and supply-voltage-independent voltage in a terminal thereof;

a comparator circuit, connected to compare the reduced voltage with the voltage provided by said voltage reference device, and to produce an output signal which is dependent on the difference therebetween;

a current mirror operatively connected to provide a control signal to said power transistor which is dependent on the output signal from said comparator circuit, said control signal being combined, to control said power transistor, with the master control signal from said driver circuit.

25. The system of claim 24, wherein said power transistor is a field effect transistor.

26. The system of claim 24, wherein said current mirror has a supply terminal connected to the inductive load.

27. The system of claim 24, wherein said voltage reference is provided by a Widlar device.

28. The system of claim 24, further comprising a temperature-independent circuit connected to provide said voltage reference.

29. A system, comprising:

an inductive load to be given;

a power field effect transistor, having source and drain terminals connected, in series with said inductive load between a node at a fixed supply voltage and a node of constant potential;

a driver circuit which provides to said transistor a master control signal which generally selects when said transistor is to be turned on and off;

a terminal for connection to a node between said inductive load and said power transistor;

first and second resistors, connected in series between a first node which is between said inductive load and said transistor and said node of constant potential, to produce at an intermediate node a reduced voltage which is proportional to the voltage of said first node;

a voltage reference circuit, which provides a substantially constant temperature-independent and supply-voltage-independent voltage at a terminal thereof;

a comparator, connected to compare said reduced voltage with the voltage provided by said voltage reference device, and to produce at an output terminal thereof an output signal which is dependent on the difference between the reduced voltage and of the voltage from said voltage reference device;

a current mirror having input and output legs connected to said first node to be powered therefrom; said input leg being connected to said output terminal of said comparator, and said output leg being connected to a gate terminal of said transistor to provide a control signal which is dependent on the output signal from said comparator said control signal being combined at said gate terminal with the master control signal from said driver circuit.

30. The system of claim 29, wherein said control current output of said current mirror is connected directly to an output connection for connection to a control terminal of the power transistor.

31. The system of claim 29, wherein said current mirror has a supply terminal connected to the inductive load.

32. The system of claim 29, wherein said voltage reference circuit is a Widlar device.

33. The system of claim 29, further comprising a temperature-independent circuit connected to provide said voltage reference.

34. A method of controlling an inductive load with a series power transistor, comprising the steps of:

a. receiving a master control signal which generally selects times for turning the transistor off and on;

b. automatically comparing the voltage of a node between the transistor and the load to a predetermined temperature-independent and supply-voltage-independent constant voltage, and providing an output current whenever the voltage of said node exceeds said predetermined constant voltage;

c. mirroring said output current through a circuit stage which is powered by and referenced to the voltage of said node, to provide a corresponding control current; and d. combining said control current with a current corresponding to the master control signal, to provide a drive signal which is connected to control the transistor.

* * * * *